United States Patent
Yoshida et al.

(10) Patent No.: US 9,685,862 B2
(45) Date of Patent: Jun. 20, 2017

(54) SEMICONDUCTOR DEVICE AND SEMICONDUCTOR MODULE

(71) Applicant: Mitsubishi Electric Corporation, Tokyo (JP)

(72) Inventors: Hiroshi Yoshida, Fukuoka (JP); Kyoko Oyama, Fukuoka (JP); Yoshikazu Tanaka, Fukuoka (JP); Shiori Uota, Tokyo (JP); Nobuya Nishida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 527 days.

(21) Appl. No.: 14/293,326

(22) Filed: Jun. 2, 2014

(65) Prior Publication Data

US 2015/0115718 A1 Apr. 30, 2015

(30) Foreign Application Priority Data

Oct. 24, 2013 (JP) .................................. 2013-221195

(51) Int. Cl.
*G05F 1/00* (2006.01)
*H02M 3/158* (2006.01)
(Continued)

(52) U.S. Cl.
CPC ............ *H02M 3/158* (2013.01); *H02M 1/08* (2013.01); *H02M 3/06* (2013.01); *H02M 7/5387* (2013.01);
(Continued)

(58) Field of Classification Search
CPC .......... H02M 3/158; H02M 3/06; H02M 1/08; H02M 7/5387
(Continued)

(56) References Cited

U.S. PATENT DOCUMENTS 3,573,614 A * 4/1971 Wittbrodt ................ G04F 10/04
324/102
4,249,236 A * 2/1981 Omae ................... H02M 7/1626
363/87

(Continued)

FOREIGN PATENT DOCUMENTS

CN 1630172 A 6/2005
JP 2011-234430 A 11/2011

OTHER PUBLICATIONS

An Office Action issued by the Chinese Patent Office on Sep. 30, 2016, which corresponds to Chinese Patent Application No. 201410504762.5 and is related to U.S. Appl. No. 14/293,326; with English language partial translation.

*Primary Examiner* — Viet Q Nguyen
(74) *Attorney, Agent, or Firm* — Studebaker & Brackett PC

(57) ABSTRACT

A semiconductor device includes: a voltage-dividing resistor circuit including first and second resistors connected in series between a power supply potential and a reference potential and outputting a potential at a point of connection between the first and second resistors; a transient response detection circuit including a third resistor having a first end connected to the power supply potential and a capacitor connected between a second end of the third resistor and the reference potential, and outputting a potential at a point of connection between the third resistor and the capacitor; an AND circuit ANDing an output signal of the voltage-dividing resistor circuit and an output signal of the transient response detection circuit; and an output circuit, wherein switching of the output circuit is controlled by an output signal of the AND circuit.

13 Claims, 15 Drawing Sheets

(51) Int. Cl.
*H02M 3/06* (2006.01)
*H02M 1/08* (2006.01)
*H02M 7/5387* (2007.01)

(52) U.S. Cl.
CPC ... *H03K 2217/0036* (2013.01); *Y10T 307/609* (2015.04)

(58) Field of Classification Search
USPC .................... 323/272, 274; 307/14, 108
See application file for complete search history.

(56) References Cited

U.S. PATENT DOCUMENTS

| | | | | |
|---|---|---|---|---|
| 4,743,864 A * | 5/1988 | Nakagawa | ............ | H03L 7/0802 307/14 |
| 5,768,207 A * | 6/1998 | Raad | ............ | G11C 5/143 365/189.09 |
| 5,917,360 A * | 6/1999 | Yasutake | ............ | H03K 17/04106 327/103 |
| 6,100,814 A * | 8/2000 | Doyle | ............ | G06F 1/3209 340/12.5 |
| 7,199,566 B2 * | 4/2007 | Suzuki | ............ | G05F 1/565 323/274 |
| 8,305,065 B2 * | 11/2012 | Sase | ............ | H02M 3/156 323/283 |
| 8,829,872 B1 * | 9/2014 | Pierson | ............ | H02M 1/14 323/272 |
| 2003/0044724 A1 * | 3/2003 | Van Itallie | ............ | G03F 7/70466 430/313 |
| 2003/0222629 A1 * | 12/2003 | Inoue | ............ | H02M 3/1588 323/224 |
| 2005/0144539 A1 | 6/2005 | Orita | | |
| 2006/0044724 A1 * | 3/2006 | Ishii | ............ | H02M 3/158 361/90 |
| 2006/0133000 A1 * | 6/2006 | Kimura | ............ | G05F 1/5735 361/93.1 |
| 2006/0187604 A1 * | 8/2006 | Ohshima | ............ | H02H 3/093 361/100 |
| 2009/0278516 A1 * | 11/2009 | Bhagwat | ............ | H02M 3/1588 323/270 |
| 2010/0180059 A1 * | 7/2010 | Sugiura | ............ | G06F 1/24 710/262 |
| 2011/0260707 A1 | 10/2011 | Imanishi et al. | | |
| 2012/0063045 A1 * | 3/2012 | Shearon | ............ | H02H 3/08 361/65 |
| 2015/0200592 A1 * | 7/2015 | Chang | ............ | H02M 3/156 323/271 |
| 2016/0156271 A1 * | 6/2016 | Nishijima | ............ | H02M 3/33523 363/21.12 |

* cited by examiner

SEMICONDUCTOR DEVICE AND SEMICONDUCTOR MODULE

BACKGROUND OF THE INVENTION

Field of the Invention

The present invention relates to a semiconductor device and a semiconductor module which can reduce power consumption in an environment in which a high voltage is applied and control output in accordance with a potential state with respect to the reference potential of the supply voltage.

Background Art

In inverter circuits or the like, two totem-pole-connected switching elements are driven by high-side and low-side control circuits respectively. Isolated power supplies need to be used for these high-side and low-side control circuits separately.

A control circuit that controls a single-phase inverter requires a total of three isolated power supplies: two high-side isolated power supplies and one low-side isolated power supply. Furthermore, a control circuit that controls a three-phase inverter requires three high-side isolated power supplies, and therefore requires a total of four isolated power supplies, resulting in a large-scale control circuit.

There is also a configuration which uses a bootstrap circuit for a power supply of the high-side control circuit and adopts one power supply for the control circuit that controls the three-phase inverter to reduce the number of power supplies. However, since the bootstrap circuit cannot operate for a period during which the high-side switching element is ON (a bootstrap capacitor is not charged), it is difficult to adapt the bootstrap circuit to a control scheme in which the ON period of the high-side switching element is extended.

Thus, a configuration using a bootstrap compensation circuit is proposed in order to sufficiently charge the bootstrap capacitor and at the same time simplify the circuit and reduce the size thereof (e.g., see Japanese Patent Laid-Open No. 2011-234430). In the bootstrap compensation circuit, its supply voltage floats relative to a reference potential and the bootstrap compensation circuit controls ON/OFF of an output circuit according to whether the supply voltage is high or low. More specifically, a voltage-dividing resistor circuit is provided which detects a potential with respect to a reference potential of the supply voltage. The output thereof is inputted to an inverter circuit or the like which is set to a predetermined threshold, H and L are defined as a potential state and the output circuit is driven in accordance therewith.

SUMMARY OF THE INVENTION

Although the prior art has quite a simple circuit configuration, its response speed becomes a problem when this circuit is applied to an environment where a high voltage is applied. The voltage-dividing resistor circuit needs to be set up between the power supply and the reference potential. Reducing a current that flows through the voltage-dividing resistor requires a voltage-dividing resistor circuit having a high resistance value. Therefore, although current consumption at the voltage-dividing resistor can be reduced, a time constant of a CR circuit formed of the resistance and a parasitic capacitance accompanying the resistance increases, causing the response speed to drop.

Given heat dissipation or the like of a normal IC package, permissible power consumption is several hundreds of mW or less. Satisfying this condition under an applied voltage of 600 V or 1200 V requires a voltage-dividing resistor on the order of MΩ. When the parasitic capacitance accompanying this resistance is several pF, its time constant is MΩ×several pF and the response speed becomes on the order of µs. On the other hand, a transient response of a voltage between the supply voltage and reference potential is on the order of several kV/µs. A response takes place at the order of µs and excessive power of several tens W or the like is applied to the load and output circuit by the time the output circuit is turned OFF, causing the circuit to break down.

In view of the above-described problems, an object of the present invention is to provide a semiconductor device and a semiconductor module which can reduce power consumption in an environment in which a high voltage is applied and control output in accordance with a potential state with respect to the reference potential of the supply voltage.

According to the present invention, a semiconductor device includes: a voltage-dividing resistor circuit including first and second resistors connected in series between a power supply potential and a reference potential and outputting a potential at a point of connection between the first and second resistors; a transient response detection circuit including a third resistor having a first end connected to the power supply potential and a capacitor connected between a second end of the third resistor and the reference potential, and outputting a potential at a point of connection between the third resistor and the capacitor; an AND circuit ANDing an output signal of the voltage-dividing resistor circuit and an output signal of the transient response detection circuit; and an output circuit, wherein switching of the output circuit is controlled by an output signal of the AND circuit.

In the present invention, since the transient response detection circuit allows the output circuit to be switched at a high speed, even when a resistance value of the voltage dividing circuit is increased to reduce power consumption, it is possible to prevent application of excessive power to the load and the output circuit. Therefore, it is also possible to reduce power consumption in an environment in which a high voltage is applied and control output in accordance with a potential state with respect to the reference potential of the supply voltage.

Other and further objects, features and advantages of the invention will appear more fully from the following description.

DETAILED DESCRIPTION OF THE PREFERRED EMBODIMENTS

A semiconductor device and a semiconductor module according to the embodiments of the present invention will be described with reference to the drawings. The same components will be denoted by the same symbols, and the repeated description thereof may be omitted.

First Embodiment

Figure 1:
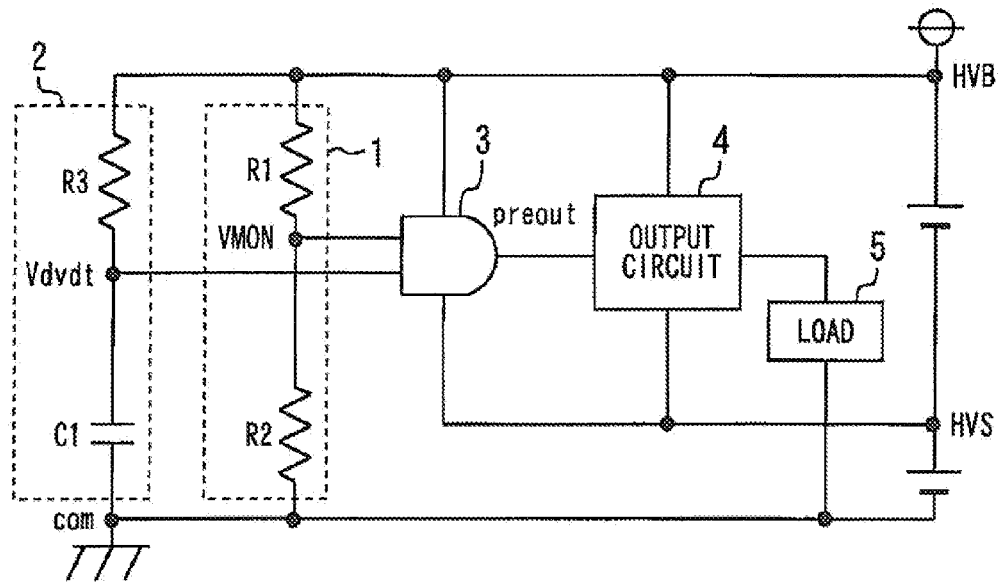
FIG. 1 is a circuit diagram illustrating a semiconductor device according to a first embodiment of the present invention.

FIG. 1 is a circuit diagram illustrating a semiconductor device according to a first embodiment of the present invention. A voltage-dividing resistor circuit 1 includes resistors R1 and R2 connected in series between a power supply potential HVB and a reference potential com and outputs a potential VMON at a point of connection between the resistors R1 and R2. A transient response detection circuit 2 includes a resistor R3, one end of which is connected to the power supply potential HVB and a capacitor C1 connected between the other end of the resistor R3 and the reference potential com, and outputs a potential Vdvdt at a point of connection between the resistor R3 and the capacitor C1.

An AND circuit 3 ANDs an output signal of the voltage-dividing resistor circuit 1 (divided potential VMON) and an output signal of the transient response detection circuit 2 (potential Vdvdt). Switching of an output circuit 4 is controlled by an output signal preout of the AND circuit 3. A load 5 is set between the output of the output circuit 4 and the reference potential com. The supply voltage of the AND circuit 3 and the output circuit 4 is HVB-HVS and this supply voltage increases or decreases with respect to the reference potential com.

ON/OFF of the output circuit 4 is galvanically controlled by the voltage-dividing resistor circuit 1 and the AND circuit 3. For example, when an HVB-corn voltage decreases and VMON becomes an H level with respect to the AND circuit 3, the output of the output circuit 4 is turned ON. On the other hand, when the HVB-corn voltage increases and VMON becomes an L level with respect to the AND circuit 3, the output of the output circuit 4 is turned OFF. Here, the output Vdvdt of the transient response detection circuit 2 becomes the same potential as HVB as DC operation and always becomes an H level with respect to the AND circuit 3, and therefore the operation of the output circuit 4 is determined only by the voltage-dividing resistor circuit 1.

Figure 2:
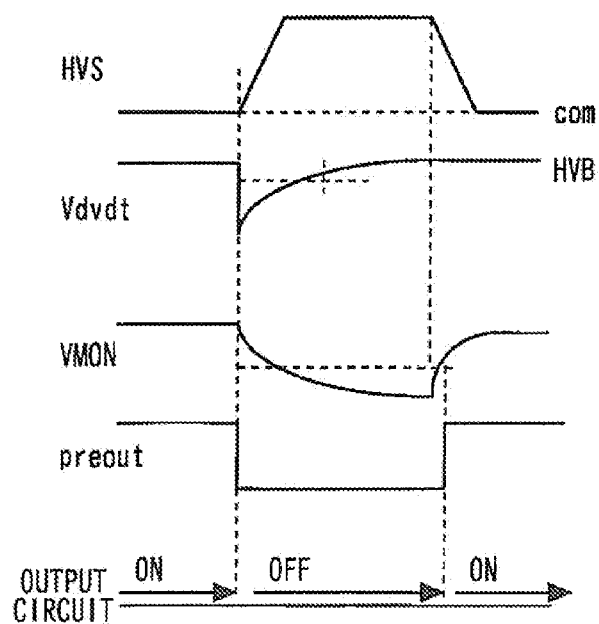
FIG. 2 is a time chart illustrating operation of the semiconductor device according to the first embodiment of the present invention.

FIG. 2 is a time chart illustrating operation of the semiconductor device according to the first embodiment of the present invention. Due to a parasitic capacitance, the output VMON of the voltage-dividing resistor circuit 1 is delayed compared to the HVB-corn potential transition. On the other hand, the output Vdvdt of the transient response detection circuit 2 maintains a potential relationship with corn before a transient response by the capacitor C1 between Vdvdt and corn immediately after the transient response starts, and gradually approaches the HVB potential.

When the HVB-corn voltage increases, the output Vdvdt of the transient response detection circuit 2 becomes an L level first, and therefore the output of the AND circuit 3 becomes an L level, which causes the output circuit 4 to turn OFF. Next, the output VMON of the voltage-dividing resistor circuit 1 becomes an L level and even after the output Vdvdt of the transient response detection circuit 2 returns to the H level, the AND circuit 3 outputs an L level and the output circuit 4 maintains the OFF state.

On the other hand, when the HVB-corn voltage decreases, since the output Vdvdt of the transient response detection circuit 2 remains at the H level with respect to the AND circuit 3, the output circuit is turned ON when the output VMON of the voltage-dividing resistor circuit 1 becomes an H level with respect to the AND circuit 3.

Figure 3:
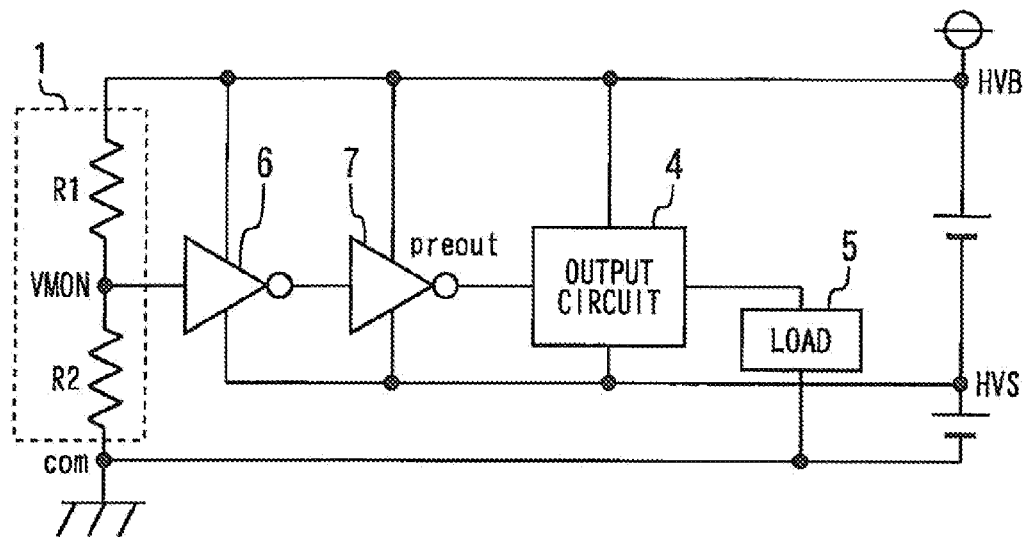
FIG. 3 is a circuit diagram illustrating a semiconductor device according to a comparative example.

Next, effects of the present embodiment will be described in comparison with a comparative example. FIG. 3 is a circuit diagram illustrating a semiconductor device according to a comparative example. In the comparative example, there is neither transient response detection circuit 2 nor AND circuit 3. The output VMON of the voltage-dividing resistor circuit 1 is inputted to the output circuit 4 via inverters 6 and 7.

Figure 4:
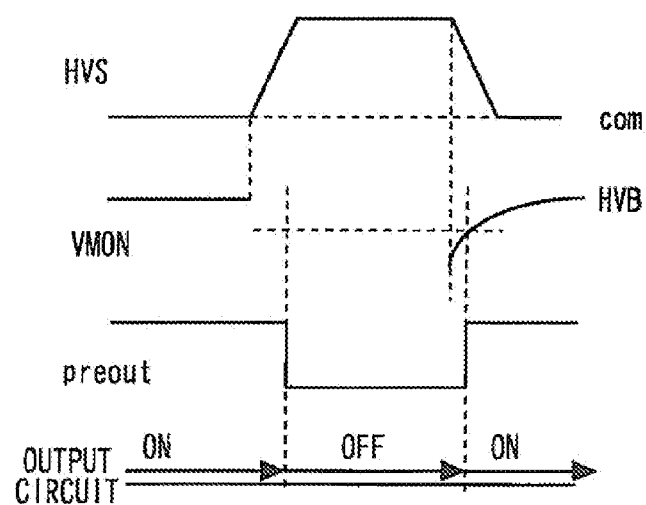
FIG. 4 is a time chart illustrating operation of the semiconductor device according to the comparative example.

FIG. 4 is a time chart illustrating operation of the semiconductor device according to the comparative example. When the power supply potential HVB rises with respect to the reference potential com, the output of the voltage-dividing resistor circuit 1 is switched and the output circuit 4 is switched from ON to OFF. However, if the response of the output VMON of the voltage-dividing resistor circuit 1 to a variation of the power supply potential HVB is slow, switching of the output circuit 4 is also delayed accordingly. As a result, excessive power is applied to the load 5 for a period of time after the rise of the HVB until the output circuit 4 is turned OFF. This phenomenon is caused by increasing the resistance value of the voltage-dividing resistor circuit 1, and it is difficult to apply the comparative example to an environment in which a high voltage is applied.

In contrast, in the present embodiment, when the HVB-com voltage increases, it is possible to switch the output circuit 4 at a high speed using the transient response detection circuit 2. For this reason, even when the resistance value of the voltage-dividing resistor circuit 1 is increased to reduce power consumption, it is possible to prevent application of excessive power to the load 5 and the output circuit 4. Therefore, it is also possible to reduce power consumption in an environment in which a voltage is applied and control output in accordance with a potential state with respect to the reference potential of the supply voltage.

Second Embodiment

Figure 5:
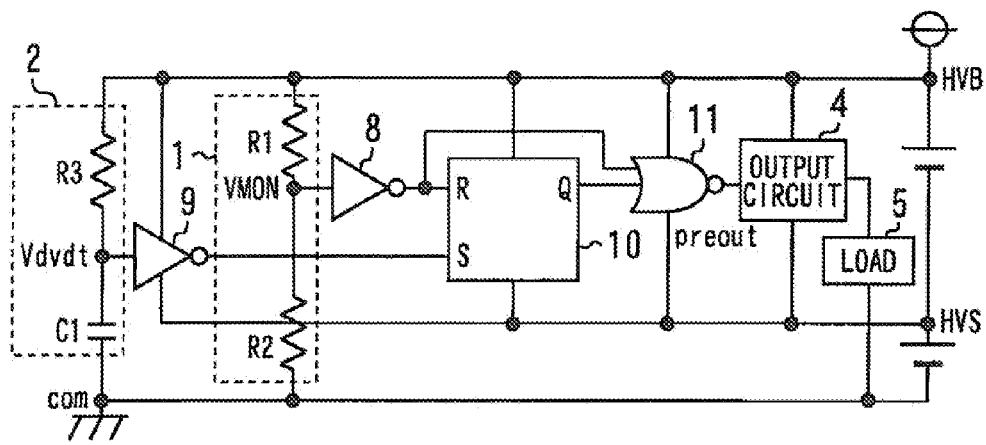
FIG. 5 is a circuit diagram illustrating a semiconductor device according to a second embodiment of the present invention.

FIG. 5 is a circuit diagram illustrating a semiconductor device according to a second embodiment of the present invention. An inverter 8 inverts an output signal of the voltage-dividing resistor circuit 1. Another inverter 9 inverts an output signal of the transient response detection circuit 2. A flip flop circuit 10 receives an output signal of the inverter 8 at a reset terminal R and receives an output signal of the inverter 9 at a set terminal S. A NOR circuit 11 NORs the output signal of the inverter 8 and the output signal of the flip flop circuit 10. Switching of the output circuit 4 is controlled by an output signal preout of the NOR circuit 11.

Figure 6:
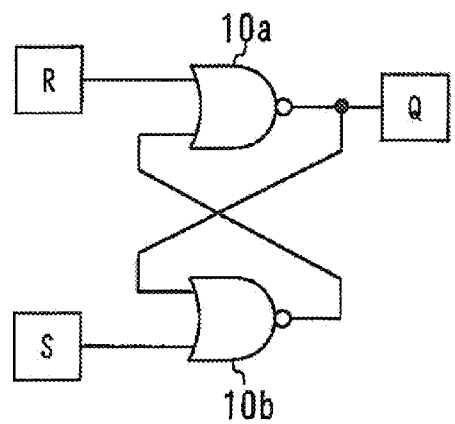
FIG. 6 is a circuit diagram illustrating the flip flop circuit.

FIG. 6 is a circuit diagram illustrating the flip flop circuit. A signal from the reset terminal R and an output signal of an NOR circuit 10b are inputted to an NOR circuit 10a. A signal from the set terminal S and an output signal of the NOR circuit 10a are inputted to the NOR circuit 10b. The output signal of the NOR circuit 10a is outputted from an output Q.

Figure 7:
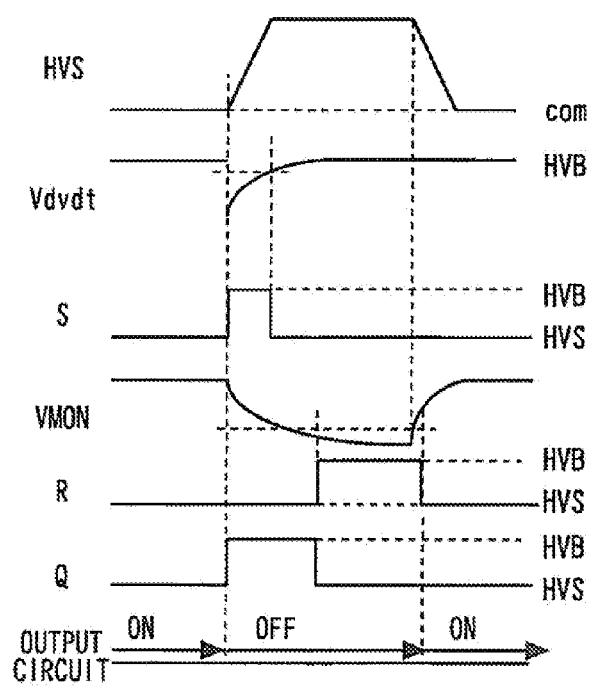
FIG. 7 is a time chart illustrating operation of the semiconductor device according to the second embodiment of the present invention.

FIG. 7 is a time chart illustrating operation of the semiconductor device according to the second embodiment of the present invention. When the HVB-com voltage increases, an H level signal from the transient response detection circuit 2 is inputted to the set terminal S of the flip flop circuit 10 and the output Q of the flip flop circuit 10 becomes an H level. Through the flip flop circuit 10, even when a transient response is completed and the signal inputted to the set terminal S of the flip flop circuit 10 becomes an L level, the output Q of the flip flop circuit 10 is kept at an H level. When an H level signal is inputted from the voltage-dividing resistor circuit 1 to the reset terminal R, the output Q of the flip flop circuit 10 becomes an L level.

That is, when the HVB-com voltage increases, the output Q of the flip flop circuit 10 becomes an H level first due to the output of the transient response detection circuit 2 and the output circuit 4 is turned OFF. The output circuit 4 remains OFF until the reset input of the flip flop circuit 10 becomes an H level by the output of the voltage-dividing resistor circuit 1. At the same time as the output Q of the flip flop circuit 10 becomes an L level, the output circuit 4 remains OFF with the output of the voltage-dividing resistor circuit 1.

In the first embodiment, when a response of the voltage-dividing resistor circuit 1 is incomplete by the time the transient response is finished, the output circuit 4 remains ON until the voltage-dividing resistor circuit 1 responds. In contrast, in the present embodiment, it is possible to cover a time difference between the response of the transient response detection circuit 2 and the response of the voltage-dividing resistor circuit 1.

Third Embodiment

Figure 8:
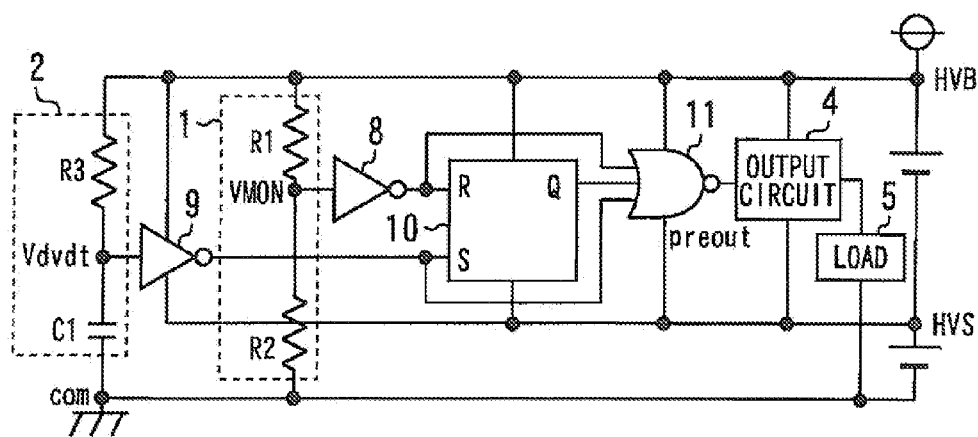
FIG. 8 is a circuit diagram illustrating a semiconductor device according to a third embodiment of the present invention.

FIG. 8 is a circuit diagram illustrating a semiconductor device according to a third embodiment of the present invention. A NOR circuit 11 NORs not only an output signal of the inverter 8 and an output signal of the flip flop circuit 10, but also an output signal of the inverter 9. The rest of the configuration is similar to that of the second embodiment.

In the present embodiment, an output of the transient response detection circuit 2 is inputted to the NOR circuit 11 while bypassing the flip flop circuit 10, and it is thereby possible to control the output circuit 4 at a high speed compared to the second embodiment in which the output of the transient response detection circuit 2 is transmitted through the flip flop circuit 10.

Fourth Embodiment

Figure 9:
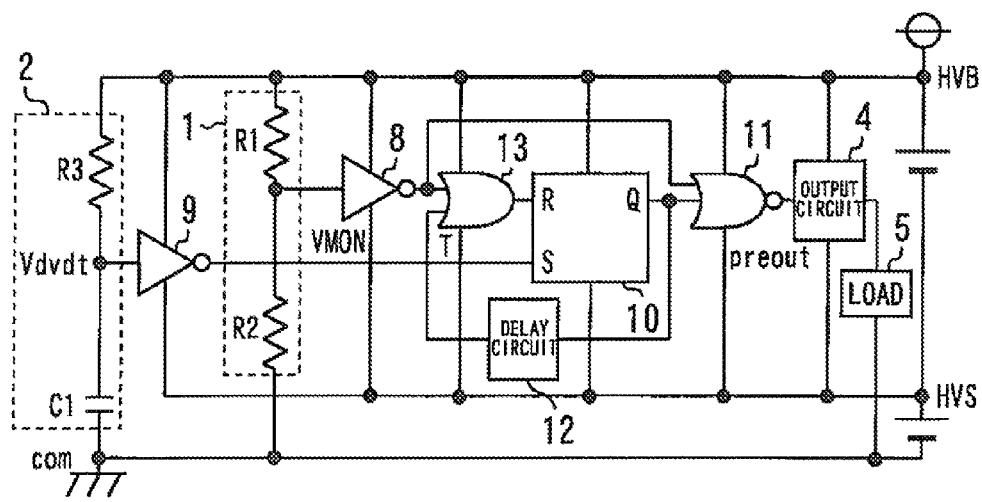
FIG. 9 is a circuit diagram illustrating a semiconductor device according to a fourth embodiment of the present invention.

FIG. 9 is a circuit diagram illustrating a semiconductor device according to a fourth embodiment of the present invention. A delay circuit 12 delays an output signal of the flip flop circuit 10. An OR circuit 13 ORs an output signal of the delay circuit 12 and an output signal of the inverter 8 and inputs the resultant signal to the reset terminal of the flip flop circuit 10. The rest of the configuration is the same as that of the second embodiment.

Figure 10:
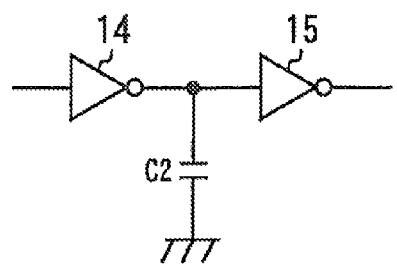
FIG. 10 is a diagram illustrating the delay circuit.

FIG. 10 is a diagram illustrating the delay circuit. Inverters 14 and 15 are connected in series. A capacitor C2 is connected between a point of connection of the two inverters and a grounding point.

Figure 11:
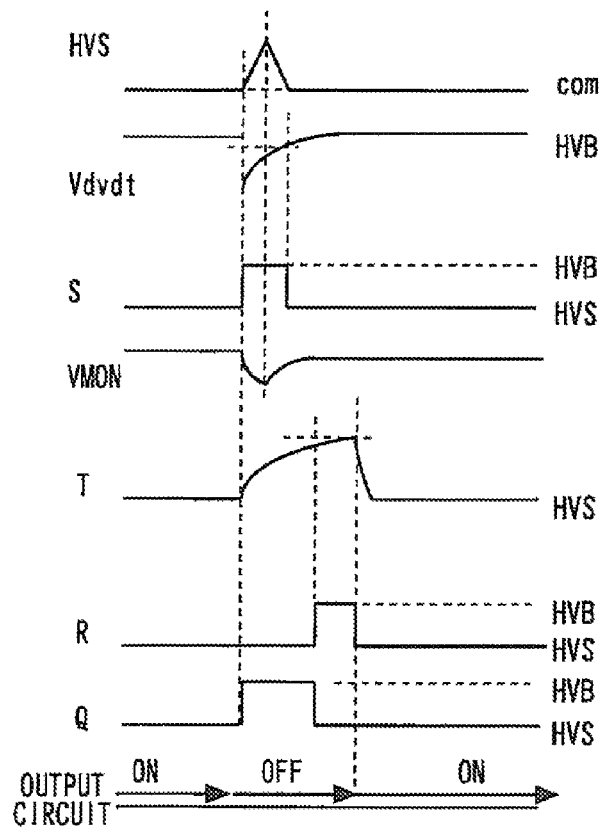
FIG. 11 is a time chart illustrating operation of the semiconductor device according to the fourth embodiment of the present invention.

FIG. 11 is a time chart illustrating operation of the semiconductor device according to the fourth embodiment of the present invention. When the HVB-com voltage increases, an output of the transient response detection circuit 2 is inputted to the set terminal S of the flip flop circuit 10 and the output of the flip flop circuit 10 becomes an H level. The signal is then delayed by a predetermined time in the delay circuit 12, inputted to the reset terminal R of the flip flop circuit 10 and the output Q of the flip flop circuit 10 is returned to an L level.

When the time period during which the potential of HVB-com increases is shorter than the time period during which the output of the voltage-dividing resistor circuit 1 responds, in the second embodiment, there may be a case where the output of the flip flop circuit 10 which has become an H level by a response of the transient response detection circuit 2 cannot be reset to an L level and the output circuit 4 cannot be turned ON despite the H level of the voltage-dividing resistor circuit 1. In contrast, in the present embodiment, a self-reset may be made by the delay circuit 12, allowing the output circuit 4 to turn ON.

Fifth Embodiment

Figure 12:
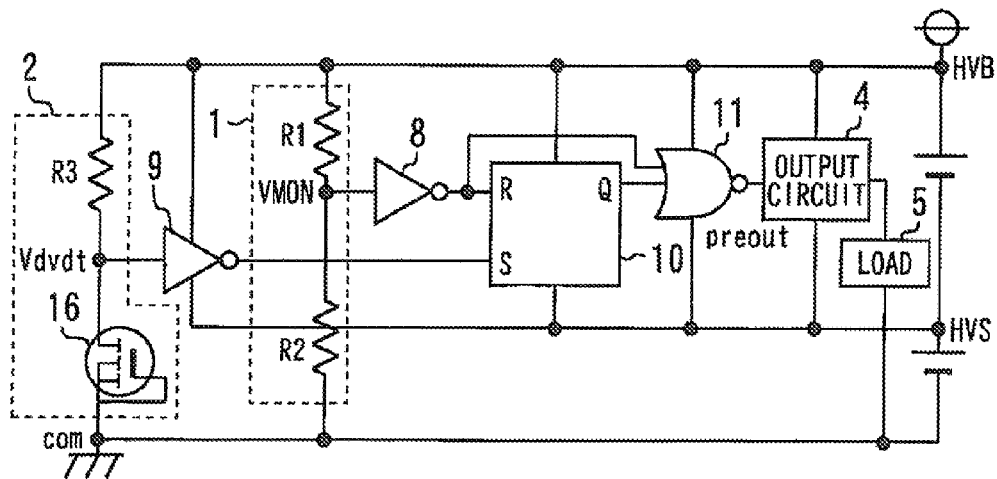
FIG. 12 is a circuit diagram illustrating a semiconductor device according to a fifth embodiment of the present invention.

FIG. 12 is a circuit diagram illustrating a semiconductor device according to a fifth embodiment of the present invention. The capacitor of the transient response detection circuit 2 is configured of a parasitic capacitance accompanying a high withstand voltage MOS element 16. This allows the present circuit to be used even in an environment in which a high voltage is applied between HVB and com. The rest of the configuration and effects are the same as those of the second embodiment.

Sixth Embodiment

Figure 13:
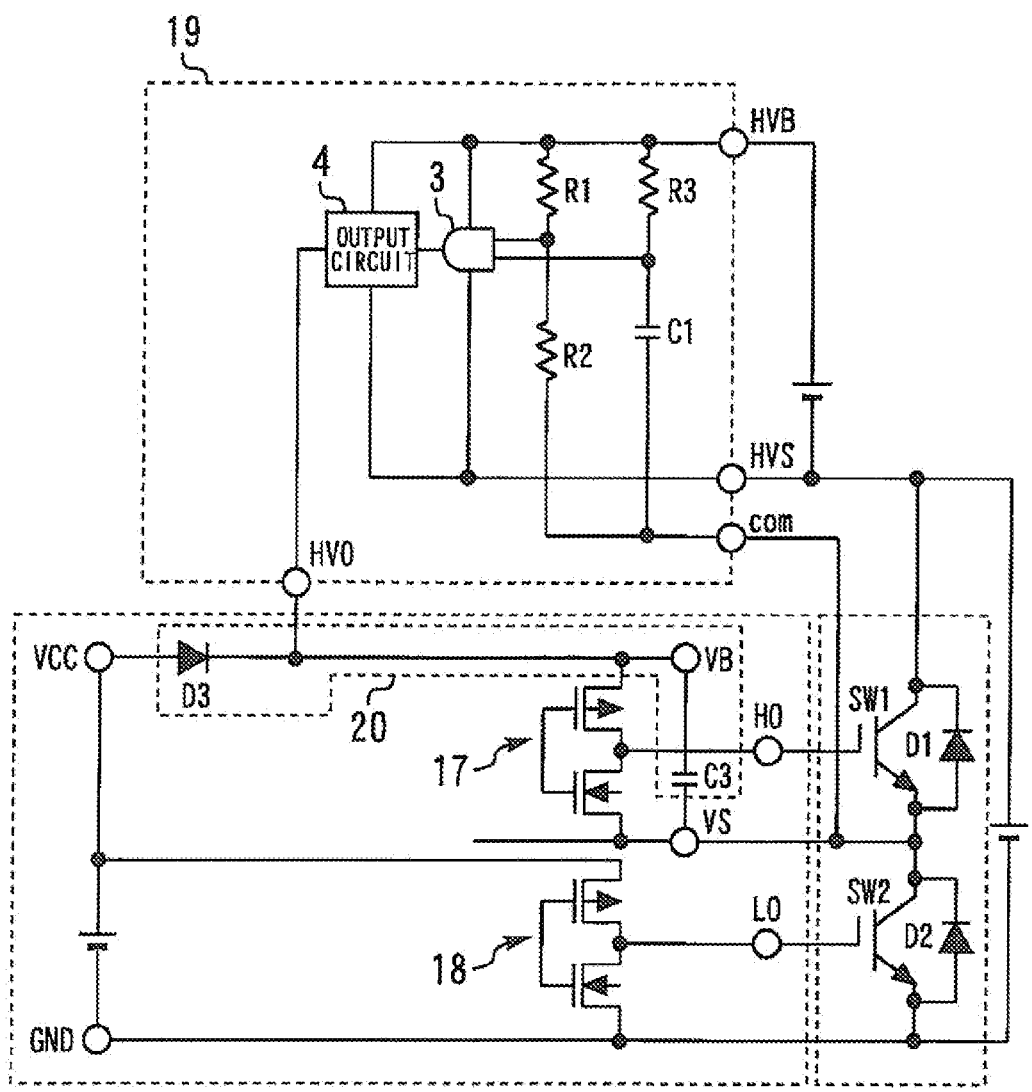
FIGS. 13 to 15 are circuit diagrams illustrating a semiconductor module according to a sixth embodiment of the present invention.
Figure 14:
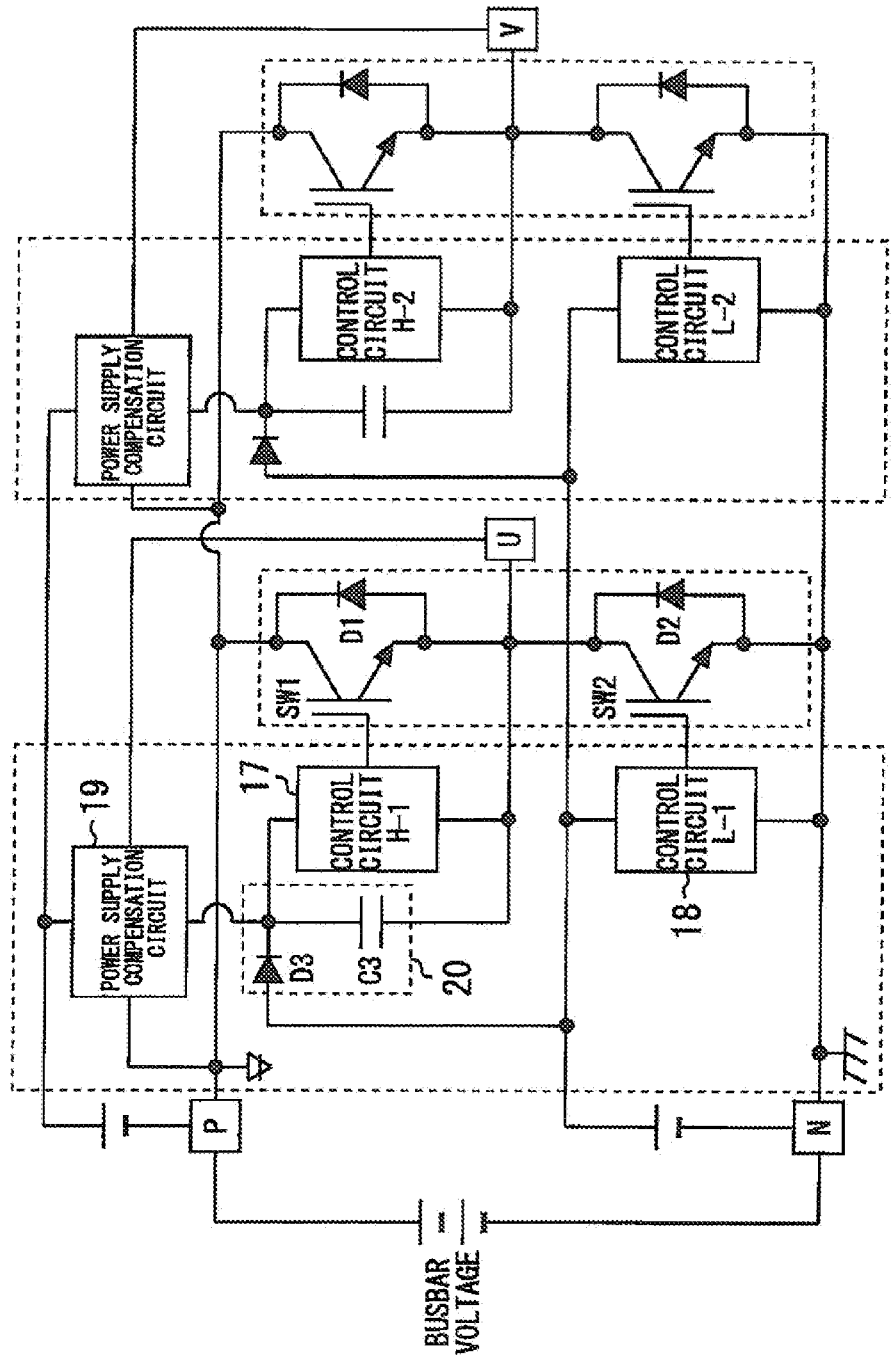
Figure 15:
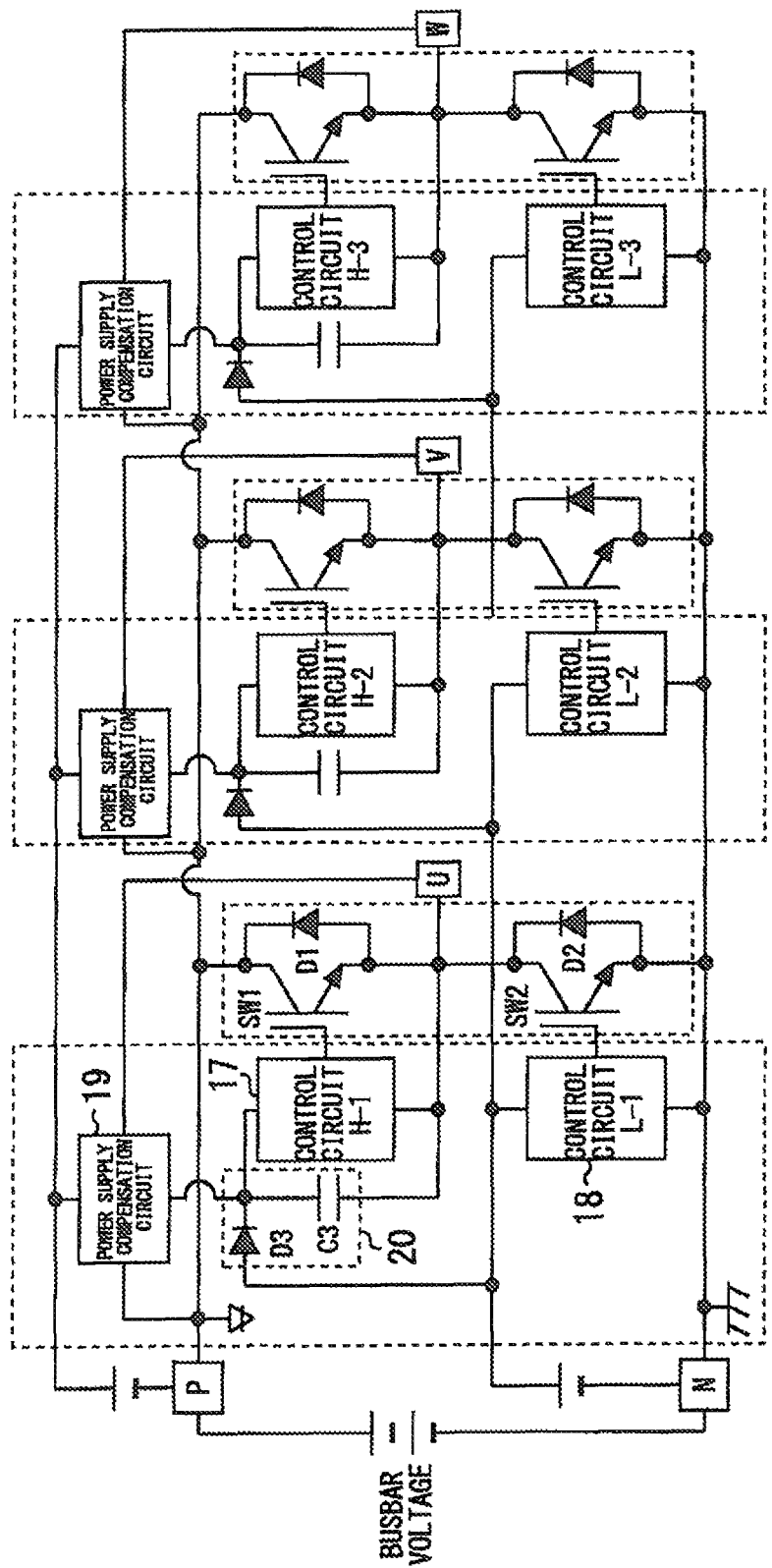

FIGS. 13 to 15 are circuit diagrams illustrating a semiconductor module according to a sixth embodiment of the present invention. In FIG. 13, a high-side switching element SW1 and a low-side switching element SW2 are totem-pole-connected. A high-side control circuit 17 controls the high-side switching element SW1 and a low-side control circuit 18 controls the low-side switching element SW2. Diodes D1 and D2 are connected in reverse parallel to the switching elements SW1 and SW2 respectively.

A power supply compensation circuit 19 is applicable to the semiconductor devices of the first to fifth embodiments and is equivalent to a bootstrap compensation circuit here. Assuming the potential at a point of connection between the high-side switching element SW1 and the low-side switching element SW2 as the reference potential corn, the power supply compensation circuit 19 supplies the output voltage of the output circuit 4 to the high-side control circuit 17.

A diode D3 is connected between a power supply VCC and a high-voltage terminal VB of the high-side control circuit 17. A capacitor C3 is connected between the high-voltage terminal VB and a low-voltage terminal VS of the high-side control circuit 17. The diode D3 and the capacitor C3 constitute a bootstrap circuit 20. This bootstrap circuit 20 supplies power to the high-side control circuit 17.

FIG. 14 shows a case with a single-phase inverter and FIG. 15 shows a case with a three-phase inverter. Power supplies to high-side control circuits H-1, H-2 and H-3 are supplied from the power supply compensation circuit 19 and the bootstrap circuit 20. The semiconductor devices of the first to fifth embodiments are applied to the power supply compensation circuit 19.

The control circuits H-1, H-2 and H-3 control the high-side switching element SW1. Control circuits L-1, L-2 and L-3 control the low-side switching element SW2. The power supply compensation circuit 19 supplies power to the control circuits H-1, H-2 and H-3 from a power supply using a busbar voltage positive potential (P potential) as a reference.

In the conventional structure without the bootstrap circuit 20, an isolated power supply is required for each of the control circuits H-1, H-2 and H-3. In contrast, the present embodiment provides the bootstrap circuit 20, and can thereby reduce the number of isolated power supplies and contribute to a size reduction and cost reduction of the power supply circuit through a reduction in the number of parts. More specifically, in the case with a single-phase inverter, three power supplies can be reduced to two power supplies, and in the case with a three-phase inverter, four power supplies can be reduced to two power supplies.

In the conventional structure without the power supply compensation circuit 19, the bootstrap circuit 20 becomes inoperable during an ON period of the high-side switching element SW1. In contrast, in the present embodiment, since power can be supplied from the power supply compensation circuit even during the ON period of the high-side switching element SW1, it is possible to support a control scheme in which the ON period of the high-side switching element SW1 is extended.

Seventh Embodiment

Figure 16:
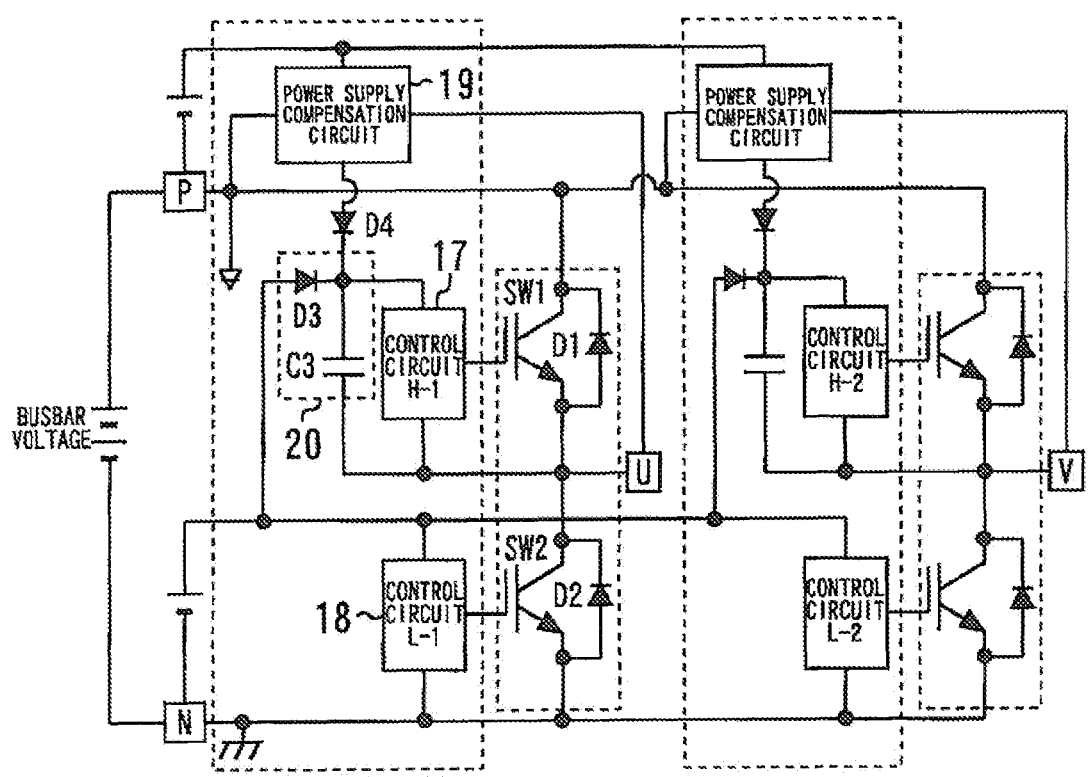
FIG. 16 is a circuit diagram illustrating a semiconductor module according to a seventh embodiment of the present invention.

FIG. 16 is a circuit diagram illustrating a semiconductor module according to a seventh embodiment of the present invention. A diode D4 is connected between the power supply compensation circuit 19 and the high-side control circuit 17. A general power diode can be used as the diode D4. The rest of the configuration is the same as that of the semiconductor module in FIG. 14 of the sixth embodiment.

When a negative potential (potential U or V or W) of a power supply of a high-side control circuit H-n exceeds a busbar voltage positive potential (potential P) which becomes a power supply of the power supply compensation circuit 19 with a surge voltage caused by switching, in the sixth embodiment, a reverse current flow is generated from the power supply of the high-side control circuit H-n to the power supply compensation circuit 19. In contrast, in the present embodiment, the diode D4 can prevent the reverse current flow, and it is thereby possible to prevent malfunction of the control circuit.

Eighth Embodiment

Figure 17:
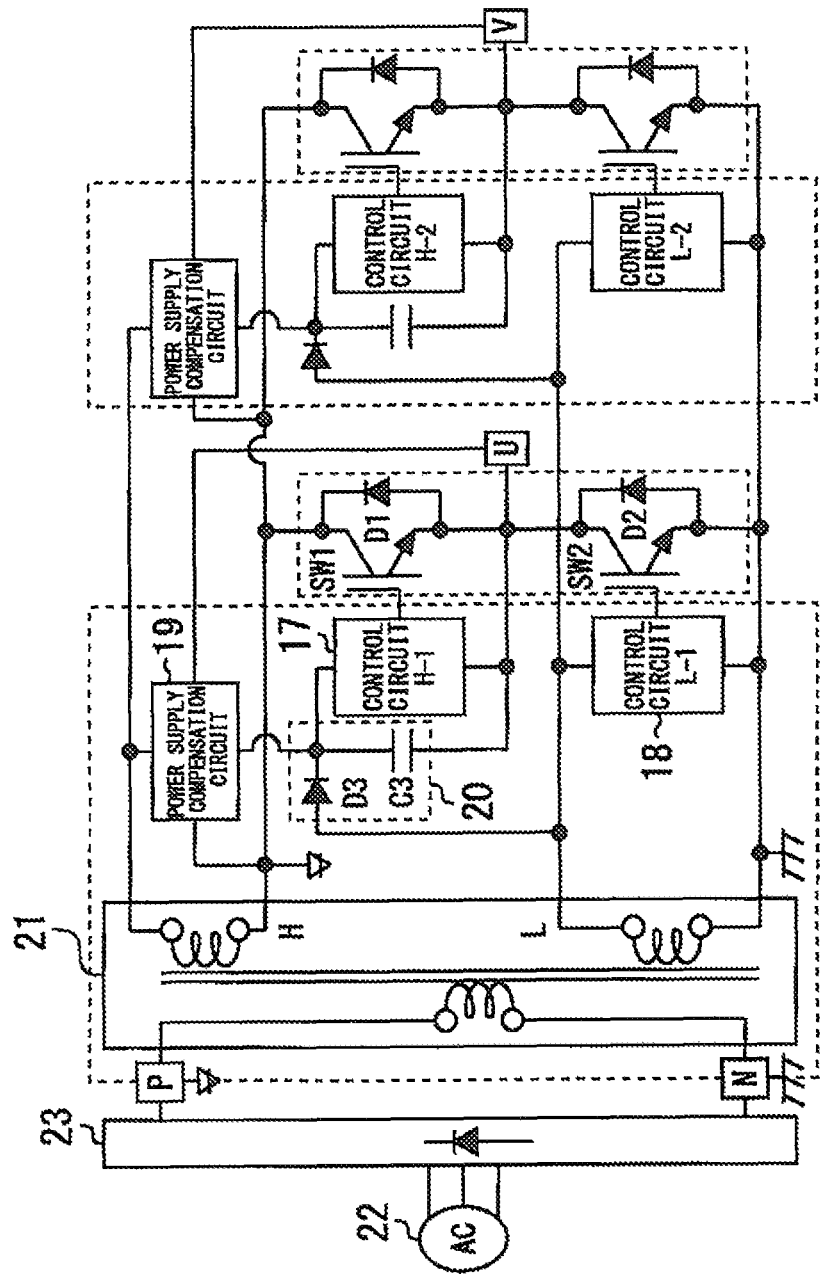
FIG. 17 and FIG. 18 are circuit diagrams illustrating a semiconductor module according to an eighth embodiment of the present invention.
Figure 18:
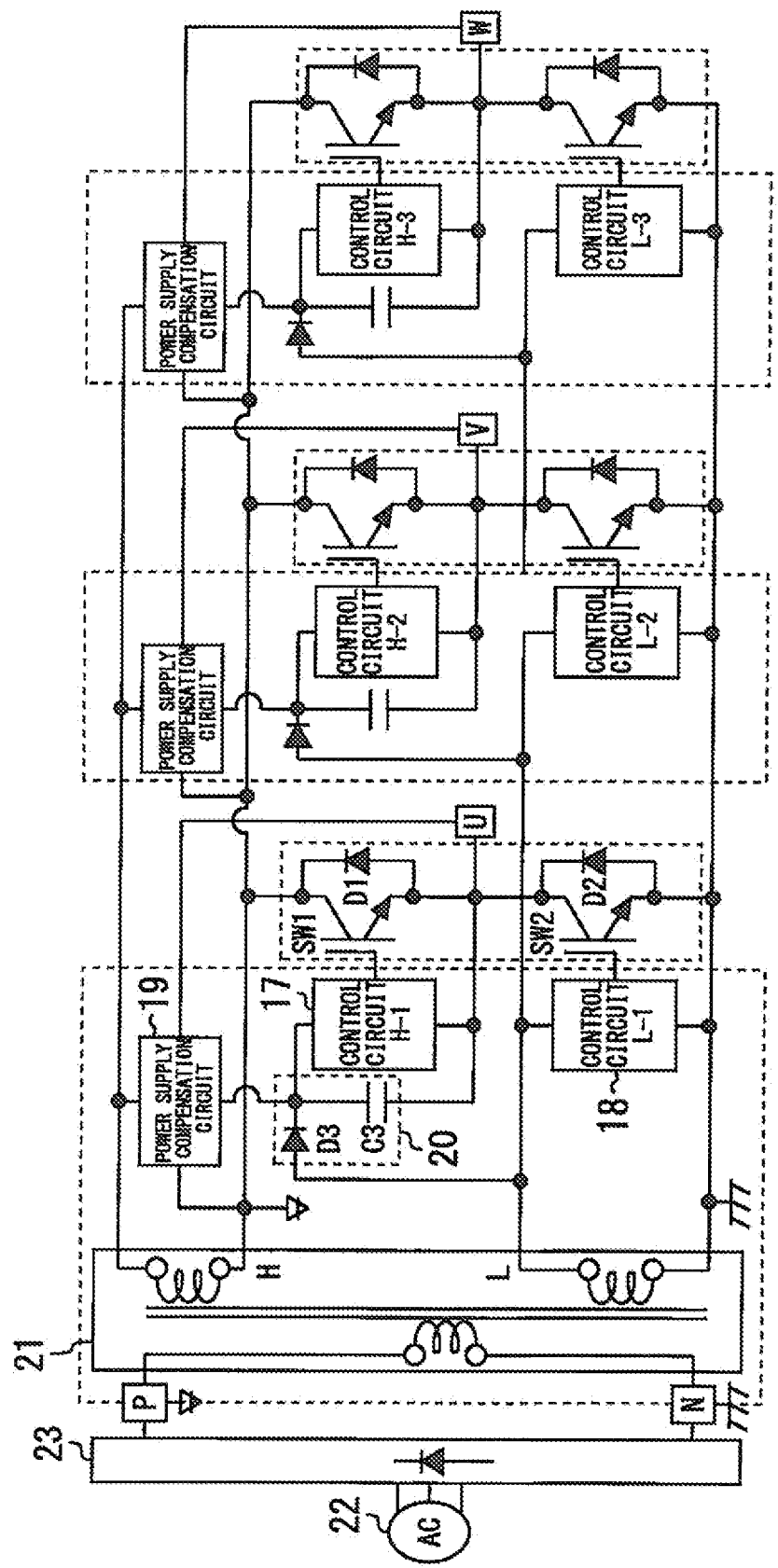

FIG. 17 and FIG. 18 are circuit diagrams illustrating a semiconductor module according to an eighth embodiment of the present invention. FIG. 17 shows a case with a single-phase inverter and FIG. 18 shows a case with a three-phase inverter.

A power supply circuit 21 uses a voltage (busbar voltage) converted to DC from an AC power supply 22 through a rectification circuit 23 as input on a primary side and constitutes isolated power supplies H and L. The isolated power supply L charges the capacitor C3 of the bootstrap circuit 20. The isolated power supply H supplies a power supply potential HVB to the semiconductor device. It is possible to obtain effects similar to those of the sixth embodiment in this case as well.

Ninth Embodiment

Figure 19:
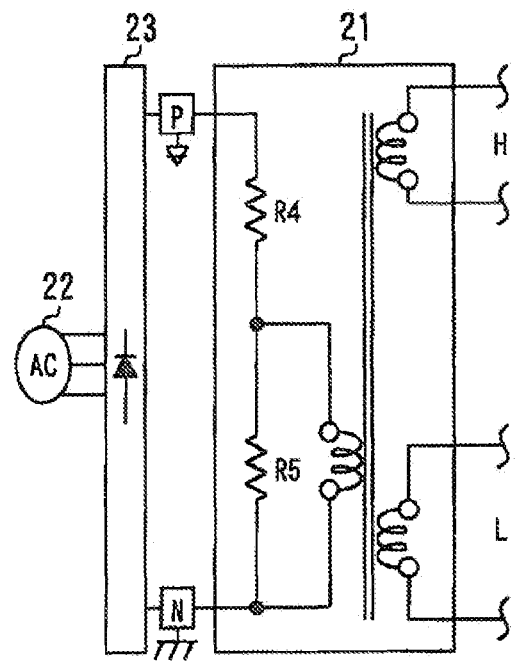
FIG. 19 is a circuit diagram illustrating a semiconductor module according to a ninth embodiment of the present invention.

FIG. 19 is a circuit diagram illustrating a semiconductor module according to a ninth embodiment of the present invention. The power supply circuit 21 has high withstand voltage resistors R4 and R5 that step down and insulate a P-N voltage. Compared to a scheme in which the P-N voltage is directly insulated, this eliminates the necessity for a withstand voltage on the primary side of the power supply circuit 21, contributing to a size reduction and cost reduction of parts.

Tenth Embodiment

Figure 20:
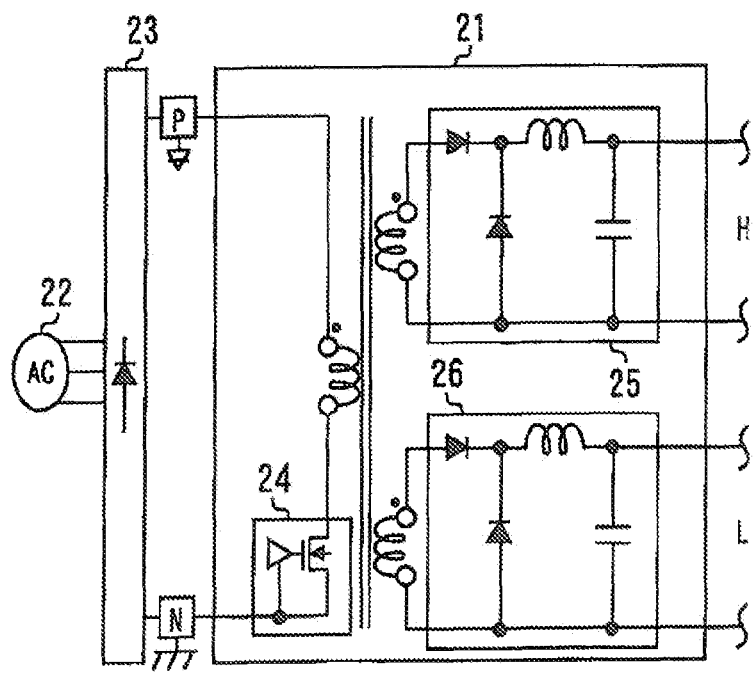
FIG. 20 and FIG. 21 are circuit diagrams illustrating a power supply circuit according to a tenth embodiment of the present invention.
Figure 21:
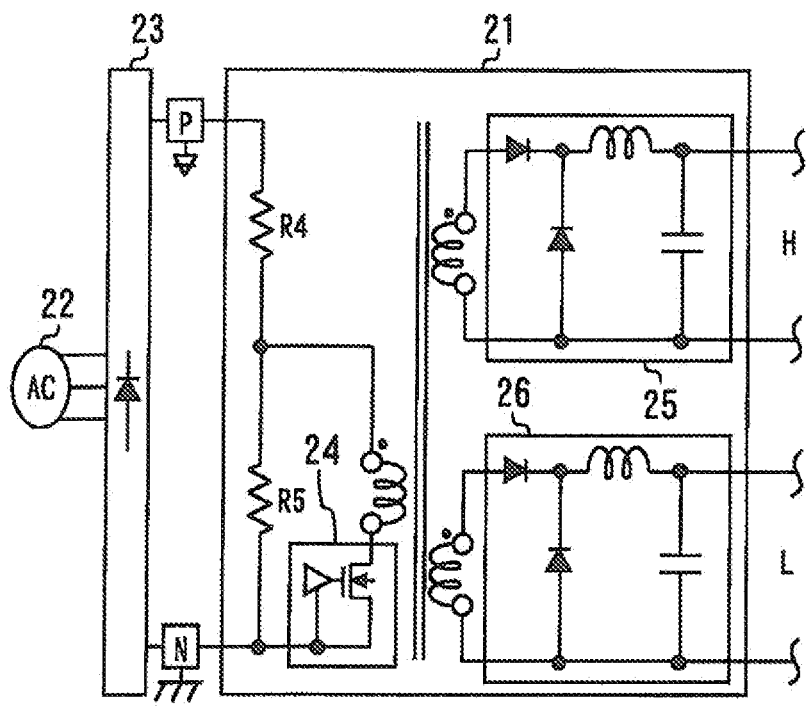

FIG. 20 and FIG. 21 are circuit diagrams illustrating a power supply circuit according to a tenth embodiment of the present invention. This power supply circuit 21 is applied to the semiconductor modules of the eighth and ninth embodiments. The power supply circuit 21 includes a primary side control circuit 24 and secondary side control circuits 25 and 26 and is configured in a forward scheme. Thus, even when circuit currents in the primary side control circuit 24 and the secondary side control circuits 25 and 26 increase, it is possible to obtain an output voltage with relatively high efficiency and high accuracy. Furthermore, this circuit can be used for large power application.

Eleventh Embodiment

Figure 22:
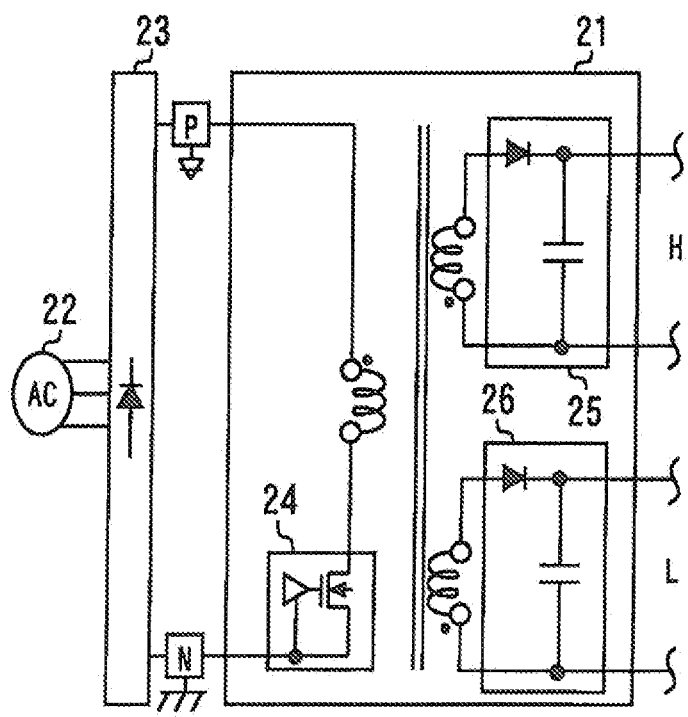
FIG. 22 and FIG. 23 are circuit diagrams illustrating power supply circuits according to an eleventh embodiment of the present invention.
Figure 23:
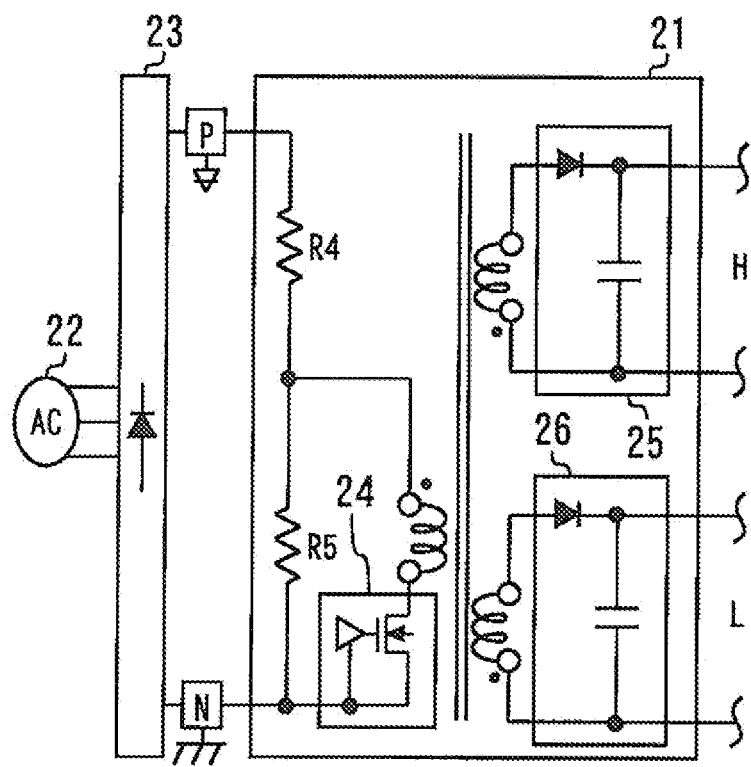

FIG. 22 and FIG. 23 are circuit diagrams illustrating power supply circuits according to an eleventh embodiment of the present invention. This power supply circuit 21 is applied to the semiconductor modules of the eighth and ninth embodiments. The power supply circuit 21 is configured in a flyback scheme. This reduces the number of components of the secondary side control circuits 25 and 26 compared to the tenth embodiment, thereby reduces the circuit scale, contributing to a cost reduction and size reduction.

Note that in the above-described embodiments, the high-side control circuit 17 and the low-side control circuit 18 are preferably configured using a single-chip IC (half-bridge IC). This makes it possible to reduce the number of parts, and thereby contribute to a size reduction, cost reduction and a reduction of a defect ratio. Moreover, since a variation between the high-side control circuit 17 and the low-side control circuit 18 is reduced, high accuracy control is possible.

All the control circuits are preferably configured using a single-chip IC (full-bridge IC). This makes it possible to reduce the number of components, and thereby contribute to a size reduction, cost reduction, and a reduction of a defect ratio. Moreover, variations of control circuits of all phases are reduced and it is thereby possible to achieve high accuracy control.

The high-side control circuit 17, low-side control circuit 18, power supply compensation circuit 19, bootstrap circuit 20 and diode D4 are preferably configured in a single-chip IC. This makes it possible to reduce the number of components, and thereby contribute to a size reduction, cost reduction, and a reduction of a defect ratio.

Some or all of semiconductors of the high-side switching element SW1 and the low-side switching element SW2 are preferably SiC or GaN. Compared to the elements of Si alone, it is possible to reduce the size of the control circuit through a size reduction of the apparatus, achieve high temperature/high speed operation and simplify a heat dissipation structure of an IPM and an apparatus using this.

Generally, diodes are often connected in reverse parallel to switching elements such as IGBT, bipolar transistor, MOSFET. Thus, the high-side switching element SW1 and the low-side switching element SW2 are preferably configured of an RC-IGBT (IGBT having an reverse parallel diode function) made of a material such as Si, SiC or GaN. Compared to a general configuration in which a switching element and a diode are formed on different chips, this facilitates assembly of an IPM.

Moreover, using the semiconductor modules according to the above-described embodiments for a power conversion system makes it possible to achieve a size reduction and cost reduction through a reduction in the number of isolated power supplies.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-221195, filed on Oct. 24, 2013 including specification, claims, drawings and summary, on which the Convention priority of the present application is based, is incorporated herein by reference in its entirety.

What is claimed is:

1. A semiconductor device comprising:
a voltage-dividing resistor circuit including first and second resistors connected in series between a power supply potential and a reference potential and outputting a potential at a point of connection between the first and second resistors;
a transient response detection circuit including a third resistor having a first end connected to the power supply potential and a capacitor connected between a second end of the third resistor and the reference potential, and outputting a potential at a point of connection between the third resistor and the capacitor;
an AND circuit ANDing an output signal of the voltage-dividing resistor circuit and an output signal of the transient response detection circuit; and
an output circuit,
wherein switching of the output circuit is controlled by an output signal of the AND circuit.

2. The semiconductor device according to claim 1, wherein the capacitor is configured of a high withstand voltage MOS element.

3. A semiconductor module comprising:
a high-side switching element and a low-side switching element which are totem-pole-connected;
a high-side control circuit controlling the high-side switching element;
a low-side control circuit controlling the low-side switching element; and
the semiconductor device according to claim 1,
wherein a potential at a point of connection between the high-side switching element and the low-side switching element is the reference potential, and
the semiconductor device supplies an output voltage of the output circuit to the high-side control circuit.

4. The semiconductor module according to claim 3, further comprising a diode connected between the semiconductor device and the high-side control circuit.

5. The semiconductor module according to claim 3, further comprising a bootstrap circuit supplying power to the high-side control circuit.

6. The semiconductor module according to claim 5, further comprising a power supply circuit inputting a voltage converted to DC from an AC power supply through a rectification circuit and constituting first and second isolated power supplies,
wherein the first isolated power supply charges a capacitor of the bootstrap circuit, and
the second isolated power supply supplies the power supply potential to the semiconductor device.

7. The semiconductor module according to claim 6, wherein the power supply circuit has a fourth resistor that steps down and insulates a P-N voltage.

8. The semiconductor module according to claim 6, wherein the power supply circuit is configured in a forward scheme.

9. The semiconductor module according to claim 6, wherein the power supply circuit is configured in a flyback scheme.

10. The semiconductor module according to claim 3, wherein the high-side control circuit and the low-side control circuit are configured using a single-chip IC.

11. The semiconductor module according to claim 9, wherein the high-side control circuit, the low-side control circuit, the semiconductor device, the bootstrap circuit, and the diode are configured using a single-chip IC.

12. The semiconductor module according to claim 3, wherein some or all of semiconductors of the high-side switching element and the low-side switching element are SiC or GaN.

13. The semiconductor module according to claim 3, wherein the high-side switching element and the low-side switching element are configured of an RC-IGBT having a reverse parallel diode function.

* * * * *